(12) United States Patent
Basheer et al.

(10) Patent No.: US 6,876,125 B2
(45) Date of Patent: Apr. 5, 2005

(54) ELASTOMERIC POLYPHOSPHAZENE TRANSDUCERS, METHODS OF MAKING, AND METHODS OF USE THEREOF

(75) Inventors: Rafil A. Basheer, Rochester Hills, MI (US); Ramil-Marcelo L. Mercado, Rolla, MO (US)

(73) Assignee: Delphi Technologies, Inc., Troy, MI (US)

( * ) Notice: Subject to any disclaimer, the term of this patent is extended or adjusted under 35 U.S.C. 154(b) by 57 days.

(21) Appl. No.: 10/648,720

(22) Filed: Aug. 26, 2003

(65) Prior Publication Data

US 2005/0046313 A1 Mar. 3, 2005

(51) Int. Cl.[7] .............................................. H01L 41/08
(52) U.S. Cl. .................... 310/311; 29/25.35; 252/62.9; 310/800
(58) Field of Search ................................. 310/311, 328, 310/330–332, 800; 29/25.35; 252/62.9

(56) References Cited

U.S. PATENT DOCUMENTS

| | | | |
|---|---|---|---|
| 4,226,840 A | | 10/1980 | Fieldhouse et al. |
| 5,166,021 A | * | 11/1992 | Odell et al. ................ 430/58.8 |
| 5,835,453 A | * | 11/1998 | Wynne et al. ............... 367/140 |
| 6,004,442 A | * | 12/1999 | Choulga et al. ............ 204/416 |
| 6,583,533 B2 | * | 6/2003 | Pelrine et al. .............. 310/309 |
| 6,768,246 B2 | * | 7/2004 | Pelrine et al. .............. 310/339 |
| 6,809,462 B2 | * | 10/2004 | Pelrine et al. .............. 310/800 |
| 6,812,624 B1 | * | 11/2004 | Pei et al. .................... 310/800 |

FOREIGN PATENT DOCUMENTS

| WO | WO 01/06575 A1 | 1/2001 |
|---|---|---|
| WO | WO 01/58973 A2 | 8/2001 |

OTHER PUBLICATIONS

Zhenyi, Ma, et al.; "High Field Electrostrictive Response of Polymers" *Journal of Polymer Science: Part B: Polyumer Physics*, vol. 32, 2721–2731, (1994).
Pelrine, Ron, et al.; "Electrostrictionof Polymer Films For Microactuators"; *Proc. IEEE 10th Annual International Workshop on Micro Electro Mechanical Systems*, Nagoya, Japan, 238–243, 1997.
Kornbushm Roy, et al.; "High–field electrostriction of elastomeric polymer dielectrics for actuation"; *SPIE*, vol. 3669, 149–161, (1999).
Allcock. H.R., et al.; *J. Am. Chem. Soc.*, 87, 4216, (1965).
Allcock. H.R., et al.; *J. Inorg. Chem.*, 5, 1709, (1966).
Allcock. H. R., et al.; *Inorg. Chem.*, 5, 1716 (1966).
Neilson, R. H. et al.; "Poly(alky/arylphosphazenes) and Their Precursors"; *Chem. Rev.*, 88, 541–562 (1988).
Wisian–Neilson, P., et al.; "Poly(dimethylphosphazene), $Me_2PN)_n$"; *J. Am. Chem. Soc.*; 117, 7035 (1995).
Honeyman, C. H., et al.; "Ambient Temperature Synthesis of Poly(dichlorophosphazene) with Molecular Weight Control"; *J. Am. Chem. Soc.*; 117, 7035–7036 (1995).
Allcock, H. R.; "Rational Design and Synthesis of New Plymeric Materials"; *Science*; 255, 1106–1112 (1992).
Pelrine, Ron, et al; "High–Speed Electrically Actuated Elastomers with Strain Greater than 100%"; www.sciencemag.org *SCIENCE*; 287, Feb. 4, 2000; 836–839.

* cited by examiner

*Primary Examiner*—Mark Budd
(74) *Attorney, Agent, or Firm*—Scott A. McBain

(57) ABSTRACT

This disclosure relates to transducers, methods of making transducers and methods of converting between electrical energy and mechanical energy. The transducers comprise an elastomeric film disposed between two electrodes wherein at least one electrode can be a compliant electrode. The elastomeric film comprises a polyphosphazene.

23 Claims, 1 Drawing Sheet

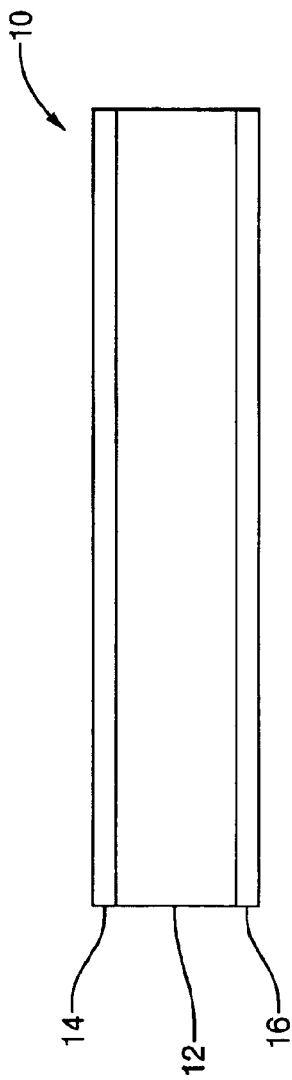
FIG. 1
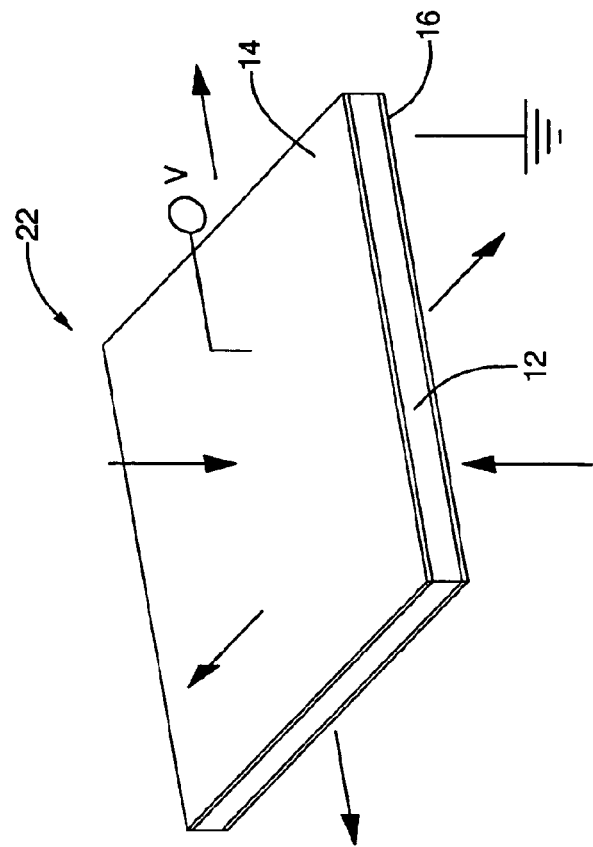
FIG. 2
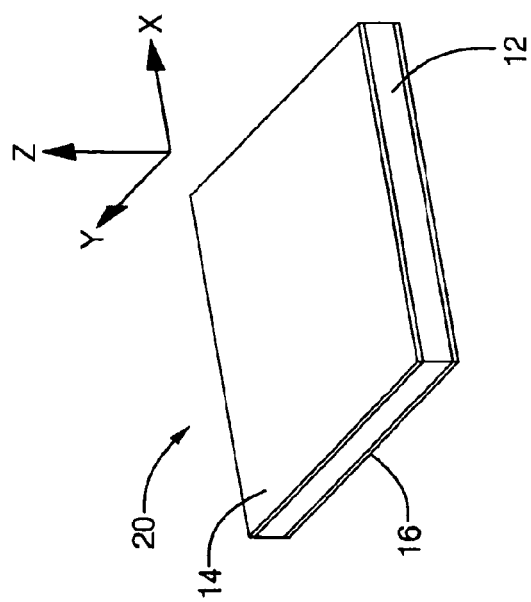

ELASTOMERIC POLYPHOSPHAZENE TRANSDUCERS, METHODS OF MAKING, AND METHODS OF USE THEREOF

BACKGROUND

The present disclosure relates to transducers for converting between electrical energy and mechanical energy and to methods of making transducers.

Means of converting between electrical energy and mechanical energy (e.g., actuators and generators) are utilized in microscale and macroscale tranducers, sensors, motors, pumps, artificial muscles, robotics, computer components, and prosthetic devices. For automotive applications, nearly every vehicle produced today, from light vehicles to heavy duty construction equipment, includes a plethora of sensors and actuators that monitor and control the operation of the vehicle. Common actuation technologies include electromagnetic motors and solenoids. In some cases, such as when the device is small in size (micro- or meso-scale devices), in lightweight devices, or in single structures incorporating a large number of devices, such technologies are not suitable. Alternative actuation or generation technologies include so-called "smart materials" such as piezoelectric ceramics, magnetostrictive materials, shape memory alloys, and electroactive polymers. While suitable for their intended purpose, some drawbacks to these materials may include low strain values, high density, low efficiency, slow response, processing difficulties, and high cost.

More recently, improvements in actuation and generation technology have been disclosed in WO 01/06575 and WO 01/58973. These references demonstrate electric field-induced deformation of an actuator containing an elastomeric dielectric material and compliant electrodes. Suitable elastomers include acrylate and polysiloxane-based polymers. Such actuators have high strain values, fast response times and high electromechanical efficiency. Strain refers to the changes in the thickness and/or area of the actuator upon application of an electric field. Some drawbacks, however, include low tear strength for polysiloxane polymers and slow response times for acrylate polymers.

There thus remains a need for improved transducers and methods of making the transducers.

SUMMARY

Disclosed herein are transducers, methods of making transducers and methods of converting between electrical energy and mechanical energy. In one embodiment, a transducer comprises a first electrode, a second electrode, and an elastomeric film disposed therebetween; wherein the electrometric film comprises a polyphosphazene having Formula (1):

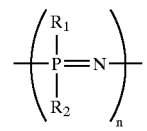

(1)

wherein each $R_1$ and $R_2$ is independently selected from chloro; bromo; iodo; substituted and unsubstituted alkyl, alkenyl, or alkynyl; aralkyl; alkaryl; aryl; heteroalkyl; heteroaryl; cyano; amino acid ester; carboxylic acid ester; oxyaryl; alkoxy, haloalkoxy; fluoroalkoxy; oxy(aliphatic) hydroxyl; oxy(alkyl)hydroxyl; oxyalkaryl; oxyaralkyl; thioaryl; thioalkyl; thioalkaryl; aliphatic ketone; aryl ketone; phosphine oxide; phosphoryl; sulfone; and sulfoxide; and wherein n is about 20 to about 50,000.

In another embodiment, a method of making a transducer comprises disposing a first electrode on a first side of an elastomeric film, and disposing a second electrode on a second side of the elastomeric film opposite the first side of the elastomeric film, wherein the elastomeric film comprises a polyphosphazene having Formula (1).

In yet another embodiment, a method of converting electrical energy into mechanical energy comprises applying an electric charge to an actuator comprising a first electrode, a second electrode, and an elastomeric film disposed there between; and producing material strain in the elastomeric film.

BRIEF DESCRIPTION OF THE DRAWINGS

The present disclosure will now be described, by way of example, with reference to the accompanying drawings, in which:

FIG. 1 is a schematic of one embodiment of a transducer of the present disclosure.

FIG. 2 is a schematic of the principle of operation of an actuator of the present disclosure.

DETAILED DESCRIPTION

As used herein and shown schematically in FIG. 1, a transducer (e.g., an actuator and/or generator) 10 comprises a soft dielectric elastomeric film 12 disposed between two electrodes 14,16. The transducers can be actuators that convert electrical energy to mechanical energy. Alternatively, the transducers can be generators that convert mechanical energy to electrical energy.

The elastomeric film 12 comprises a polyphosphazene having Formula 1:

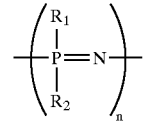

(1)

wherein each $R_1$ and $R_2$ is independently selected from chloro; bromo; iodo; substituted and unsubstituted alkyl, alkenyl, or alkynyl; aralkyl; alkaryl; aryl; heteroalkyl; heteroaryl; cyano; amino acid ester; carboxylic acid ester; oxyaryl; alkoxy, haloalkoxy; fluoroalkoxy; oxy(aliphatic) hydroxyl; oxy(alkyl)hydroxyl; oxyalkaryl; oxyaralkyl; thioaryl; thioalkyl; thioalkaryl; aliphatic ketone; aryl ketone; phosphine oxide; phosphoryl; sulfone; and sulfoxide; and wherein n is about 20 to about 50,000. Within this range, n is preferably greater than or equal to about 500, with greater than or equal to about 1,000 more preferred. Also within this range, less than or equal to about 45,000 is preferred, with less than or equal to about 40,000 more preferred. $R_1$, $R_2$ or both is preferably a $C_1$–$C_{20}$ fluoroalkoxy group, including, for example, $OCH_2CF_3$, $OCH_2CF_2CF_3$, $OCH_2CF_2H$, $OCH_2(CF_3)_2$, $OCH_2CF_2CF_2CF_3$, $OCH_2CF_2CF_2CF_2CF_2H$, and combinations comprising one or more of the foregoing substituents.

Preferred polyphosphazenes are those containing fluoroalkoxy substituents, due to the stability and polarizability of the resulting polymers. The polarizability influences the dielectric properties of the films. In addition, the structural variation in the fluoroalkoxy R groups results in polymers of variable properties ranging from thermoplastic polymers to elastomers. Mixed substitution (i.e., when $R_1$ and $R_2$ are different) leads to amorphous morphology and ultimately elastic behavior. Suitable polyphosphazenes include Formulas 2–7 as shown below:

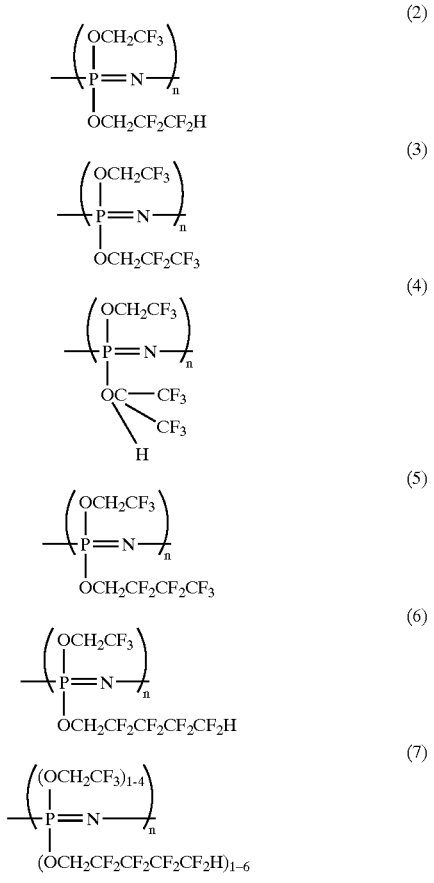

For convenience, the fluoroalkoxy-containing polyphosphazene monomers are named by assigning part of the name of the second substituent ($R_2$) followed by four digits signifying the relative molar proportion of the two substituents. TETRA refers to 4 fluorines, HEXA refers to six fluorines, HEPTA refers to 7 fluorines, and OCTA refers to 8 fluorines in the structure of the second substituent, $R_2$. For example, 5050 refers to a 50:50 molar ratio of $R_1$:$R_2$. Formula (2) is TETRA5050, (3) is PENTA5050, (4) is HEXA5050, (5) is HEPTA5050, (6) is OCTA5050, and (7) is OCTA7030.

The polyphosphazenes may also contain two or more different types of monomer units such as, for example, one or more of Formulas 2, 3, 4, 5, 6 or 7 above. In other words, the polyphosphazenes may be copolymers having more than one type of monomer unit. In addition to the fluoroalkoxy-containing monomer units, the copolymers may also contain additional monomer units having other fluorinated or non-fluorinated organic substituents. Preferred additional monomer units are those containing substituents that can provide crosslinking sites for the polyphosphazenes, referred to as crosslinkable substituents. Allyl or vinyl containing groups such as allylic functionalized alkoxide groups (e.g., eugenoxy, 2-allyl phenoxy, or combinations comprising one or more of the foregoing substituents) are examples of such crosslinkable substituents. The percent molar concentration (of total substituent content) can be about 0.25 mole percent to about 10 mole percent, preferably about 0.5 to about 5 mole percent. The precursors for the crosslinkable substituents can be added, for example, during the synthesis of the polyphosphazene.

The polyphosphazenes can be made by several different pathways including, for example, ring opening, condensation, and living cationic polymerisation. The polyphosphazenes can be formed, for example, by the method of Allcock and coworkers (Allcock H. R. et al. *J. Amer. Chem Soc.* 87, 4216 (1965); Allcock, H. R. et al. *Inorg. Chem.* 5, 1709 (1966); Allcock, H. R. et al. *Inorg. Chem.* 5, 1716 (1966)). In the method, a poly(dichlorophosphazene) starting material is formed by a thermally-induced ring-opening polymerization of a phosphonitrilic chloride trimer (Formula 8, where n is the same as that defined for Formula 1), as shown below:

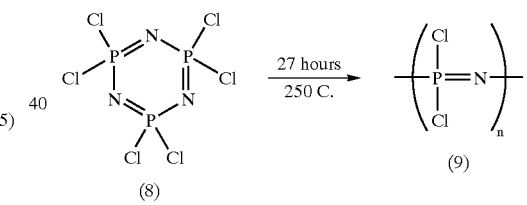

A toluene (or tetrahydrofuran) solution of the resulting poly(dichlorophosphazene) (Formula 9) can be formed. Upon addition of a sodium fluoroalkoxide, a competitive nucleophilic substitution reaction can occur as illustrated below to form the compound of Formula 10:

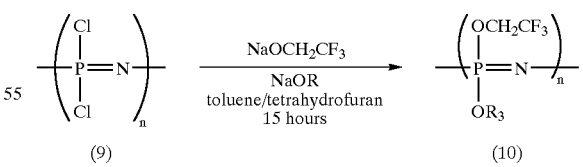

wherein $R_3$ is, for example, $CH_2CF_2CF_2H$, $CH_2CF_2CF_3$, $CH_2(CF_3)_2$, $CH_2CF_2CF_2CF_3$, $CH_2CF_2CF_2CF_2CF_2H$, and combinations comprising one or more of the foregoing substituents.

When crosslinkable substituents are desired in the final copolymer, sodium or potassium salts of allylic or vinyl functionalized alkoxides can be added to the reaction. For example, in a ring-opening condensation, the salt of an alkoxide can be added to the poly(dichlorophosphazene) either prior to or simultaneous with the sodium fluoroalkoxide (i.e., the main substituent(s) of the polyphosphazene.

Preferably the polyphosphazenes have a weight average molecular weight of about 50,000 to about 10,000,000 atomic mass units. Within this range, a molecular weight of greater than or equal to about 100,000 is preferred, with greater than or equal to about 1,000,000 more preferred. Also within this range, a molecular weight of less than or equal to about 8,000,000 is preferred, with less than or equal to about 5,000,000 more preferred. The polyphosphazenes may have a glass transition temperature of about −120° C. to about +25° C. Within this range, a glass transition temperature of less than or equal to about 10° C. is preferred, with less than or equal to about 40° C. more preferred. The preferred polyphosphazenes have a dielectric constant of about 2.5 to about 15 at 1 kilohertz (kHz). Within this range, a dielectric constant of greater than or equal to about 4 is preferred, with greater than or equal to about 5 more preferred. Also within this range, a dielectric constant of less than or equal to about 12 is preferred, with less than or equal to about 8 more preferred.

The polyphosphazenes may contain one or more additives. Suitable additives may include, for example, plasticizers, antioxidants, high dielectric constant particulates, and the like, and combinations comprising one or more of the foregoing additives. Examples of suitable plasticizers include hydrocarbon oils having a molecular weight sufficient to act as a plasticizer, hydrocarbon greases having a molecular weight sufficient to act as a plasticizer, silicone oils, silicone greases, silicone elastomers, non-ionic surfactants, polyphosphazene oils having a molecular weight sufficient to act as a plasticizer, and combinations comprising one or more of the foregoing plasticizers.

The polyphosphazenes can be cast into films or layers by various methods. For example, films may be cast from a solution of the polyphosphazene in an appropriate solvent such as, for example, acetone, fluorinated hydrocarbons, tetrahydrofuran, toluene, benzene, dimethyl sulfoxide, dimethyl formamide, hexafluoro isopropanol, and combinations comprising one or more of the foregoing solvents). The casting solution may also comprise a curing agent. The curing agent may be present in an amount of about 0.1 to about 5.0 pph (parts per hundred), with about 0.2 to about 3.0 pph preferred, and about 0.33 to about 2.0 pph more preferred). Suitable curing agents include, for example, azobis isobutyronitrile and peroxide curing agents such as benzoyl peroxide, dicumyl peroxide, lauroyl peroxide, and combinations comprising one or more of the foregoing curing agents. After solvent removal, for example under vacuum, the crosslinking reaction can be initiated by heating to a temperature of about 50° C. to about 200° C.

Preferably, the polyphosphazene films or layers 12 have a thickness of about 5 micrometers to about 250 micrometers. Within this range, a thickness of greater than or equal to about 10 micrometers is preferred, with greater than or equal to about 25 micrometers more preferred. Also within this range, a thickness of less than or equal to about 100 micrometers is preferred, with less than or equal to about 50 micrometers more preferred.

The elastomeric film 12 may be a single layer, or a multilayer film comprising at least one polyphosphazene layer. The elastomeric film 12 may comprise multiple polyphosphazene layers. In addition to the polyphosphazene layer, a multilayer film may comprise additional layers to improve the mechanical properties and/or the electrical properties of the film such as, for example, the stiffness, electrical resistance, tear resistance, and the like. Multilayer films may comprise one layer having a greater dielectric breakdown strength than the other layers. Multilayer films may comprise multiple layers of compatible materials separated by conducting or semiconducting layers (e.g., metallic or polymeric layers) to increase the breakdown strength of the actuator. Compatible materials refers to materials that comprise the same or a similar material and/or have similar mechanical and/or electrical properties.

To form a transducer 10, disposed on opposite sides of the elastomeric film 12 are first and second electrodes 14,16 (FIG. 1). The electrodes 14,16 are of a shape and material suitable to supply or receive a suitable voltage to or from the elastomeric film 12. The electrodes 14,16 are applied to at least a portion of the elastomeric film 12, and define an active area according to their geometry.

Materials used for the electrodes 14,16 may vary greatly. Suitable materials used in an electrode 14,16 may include graphite, carbon black, colloidal suspensions, metals including silver and gold, silver filled and carbon filled gels and polymers, and ionically or electronically conductive polymers. The upper electrode 14, the lower electrode 16, or both should be sufficiently conductive to support electrostatic actuation, but not so mechanically stiff so as to impede the motion of the film. Preferably, the upper electrode 14, the lower electrode 16, or both, is a compliant or flexible electrode. A compliant electrode is capable of deflection in one or more directions. Linear strain may be used to describe the deflection of a compliant electrode in one of these directions. As the term is used herein, linear strain of a compliant electrode refers to the deflection per unit length along a line of deflection. Maximum linear strains (tensile or compressive) of up to about 50 percent are possible for compliant electrodes. For some compliant electrodes, maximum linear strains of up to about 100 percent or even greater than about 100 percent are possible. An electrode may deflect with a strain less than the maximum. The compliant electrode can be a structured electrode that comprises one or more regions of high conductivity and one or more regions of low conductivity. The compliant electrode may have a thickness of about 2 to about 50 micrometers.

Compliant electrodes may be in the form of parallel traces along the surface of the elastomeric film 12. Such traces may be applied in a uniform or a non-uniform manner. In addition, the compliant electrodes may be in the form of flat electrodes or textured electrodes, i.e., those comprising in plane and out of plane dimensions.

The compliant electrodes can be formed from conductive grease, a colloidal suspension containing conductive particles, carbon nanotubes, carbon fibrils, metal in the form of a layer, a conductive polymer, or a combination comprising one or more of the foregoing materials. Compliant electrodes may comprise conductive grease such as carbon grease or silver grease or paste. Conductive carbon grease includes for example graphite in silicone oil (commercially available as Chemtronics Circuit Works CW7200). Conductive silver grease includes, for example, a silver-filled silicon grease. The conductive grease provides compliance in multiple directions. Particles may be added to increase the conductivity of the electrode. By way of example, carbon particles may be combined with a polymer binder such as silicone to produce a carbon grease that has a suitable elasticity and conductivity. Other materials may be blended into the conductive grease to alter one or more material properties. Conductive greases are suitable for the deflection of up to or even greater than or equal to about 100 percent strain.

Compliant electrodes may include colloidal suspensions. Colloidal suspensions can contain submicrometer-sized particles, such as graphite, silver, gold, and combinations thereof, in a liquid vehicle. Colloidal suspensions (i.e., those having particle sizes of about 1 to about 1000 nanometers) having a sufficient loading of conductive particles to conduct electricity at the applied voltage may be used as an electrode. A conductive grease including colloidal sized conductive particles may be mixed with a conductive silicone including colloidal sized conductive particles in a silicone binder to produce a colloidal suspension that cures to form a conductive semi-solid. An advantage of colloidal suspensions is that they may be patterned on the surface of the elastomeric film by spraying, dip coating and other techniques that allow for a thin substantially uniform coating of a liquid. To facilitate adhesion between the polyphosphazene layer and an electrode, a binder may be added to the electrode material. For example, a water-based latex rubber or silicone may be added as a binder to a colloidal suspension including such conductive materials as graphite.

Compliant electrodes may also be formed using a high aspect ratio conductive material such as carbon fibrils and carbon nanotubes (i.e., a material having an aspect ratio of greater than or equal to about 1000). These high aspect ratio carbon materials may form high surface conductivities in thin layers. High aspect ratio carbon materials may impart high conductivity to the surface of the polymer at relatively low electrode thicknesses due to the high interconnectivity of the high aspect ratio carbon materials. By way of example, thicknesses for electrodes made with common forms of carbon that are not high-aspect ratio may about 5 to about 50 micrometers, while thicknesses for electrodes made with carbon fibrils or carbon nanotubes may be about 2 to about 4 micrometers. Area expansions well over 100 percent in multiple directions are possible with carbon fibril and carbon nanotube electrodes disposed on elastomeric polymer layers 12. High aspect ratio carbon materials may include a polymer binder to increase adhesion with the elastomeric layer 12. The binder can be selected based on adhesion with a particular elastomeric layer 12 and based on elastic and mechanical properties of the elastomeric layer.

Mixtures of ionically conductive materials may also be used for the compliant electrodes. Such materials may include, for example, water based polymer materials such as glycerol or salt in gelatin, iodine-doped natural rubbers and water-based emulsions to which organic salts, such as potassium iodide are added.

The electrodes 14,16 may also be thin metallization layers (e.g., about 10 to about 100 nanometers thick) of metal such as gold. Metallized layers can be formed, for example, by sputtering, chemical epitaxy, evaporation, electroplating, and electroless plating, and the like. Alternatively, physical transfer of a metal layer to the surface of the elastomer may be employed, for example, by evaporating a metal onto a flat substrate to which it adheres poorly, and then placing the elastomer onto the metal and peeling the metal off of the substrate.

A method of making a transducer 10 comprises disposing a first electrode 14 on a first surface of an elastomeric film 12 comprising a polyphosphazene, and disposing a second electrode 16 on a second surface of the elastomeric film 12 opposite the first surface. At least one of the first and second electrodes 14,16 is preferably a compliant electrode. The electrodes 14,16 can be disposed on the elastomeric film by stenciling, spraying, screen printing, photolithography, and the like, and combinations thereof. For elastomeric or other layers that may not adhere well to a water based electrode, the surface of the elastomeric film may be pretreated by plasma etching or with a fine powder such as graphite or carbon black to increase adherence.

In operation, an actuator 10 converts electrical energy to mechanical energy thus providing the actuation mechanism. An exemplary actuator 10 comprises an elastomeric film 12 disposed between two compliant electrodes 14,16. FIG. 2 shows the actuator 10 in the resting or voltage off state 20 and in the active or voltage on state 22. Suitable actuation voltages are less than or equal to about 440 Megavolts per meter. When a voltage is applied across the electrodes 14,16, electrostatic forces cause a deflection in the film 12, e.g., the electrostatic forces compress and stretch the elastomeric film 12. Compression of the elastomeric film 12 thickness (i.e., the z-direction) brings opposite charges closer together. Planar stretching of the elastomeric film 12 (i.e., in the x-y directions) separates similar charges. The deflection in the actuator 10 may be used to produce mechanical energy and provide the actuation mechanism.

In order to enhance the electrical breakdown strength and to cause actuation in a low pre-strain direction, the actuator 10 may be pre-strained in one direction prior to applying a voltage to the actuator 10. Pre-strain can be applied, for example, by mechanically stretching the actuator in one linear direction. This can be accomplished, for example, by stretching the actuator 10 on a rigid frame and applying pre-strain in one direction. The pre-strain stiffens the film in the higher strain direction resulting in actuation along the lower pre-strain direction. The relative strain after actuation is:

$$\frac{[(\text{actuated length}) - (\text{unactuated length})]}{(\text{unactuated length})}.$$

Relative strains of greater than or equal to about 100% can be achieved by applying pre-strain prior to applying an electrical current.

The deformation of the actuator 10 can be used in many different configurations to produce actuation. For example, the actuator 10 can be stretched on a frame, post-type supports, or other supporting device. The actuator 10 can be in a tube shape or rolled into a scroll. Alternatively, the actuator 10 can be laminated to a substrate such as a flexible substrate, for example, to produce bending of the substrate.

The actuator 10 may be used as a stretched film actuator where the film is stretched over a rigid frame. Alternatively, the actuator 10 can be a diaphragm actuator in which the actuator modulates the opening and closing of an aperture. Diaphragm actuators may be used, for example, in pump or valve applications. In other applications, the actuator 10 can be a liner actuator wherein the actuator is attached between two solid objects. Linear actuators resemble the stress-strain behavior of natural muscle and are often referred to as artificial muscle.

The actuators 10 described herein may be used in applications such as, for example, robotics, sensors, motors, toys, micro-actuator applications, pumps, generators, etc. The actuators 10 may be used at both the micro-scale and macro-scale.

The invention is further illustrated by the following non-limiting examples.

EXAMPLES

Synthesis of Polyphosphazenes

Unless otherwise noted, all procedures were performed in a dry argon or nitrogen atmosphere using a glove box or dual manifold line.

Thermal polymerization of phosphonitrilic chloride: Polydichlorophosphazene was prepared by placing 50 grams of phosphonitrilic chloride trimer in a thick-walled glass ampule to which was attached a Teflon stopcock. The ampule was evacuated to about 0.1 millimeters of mercury (mm Hg) for at least 12 hours and the stopcock was closed. The phosphonitrilic chloride trimer was heated until completely molten and then allowed to cool. The stopcock was then opened and the ampule was evacuated to at least 0.1 mm Hg for 15 minutes. The contents were then heated again until molten after closing the stopcock. This cycle was repeated for a total of three times. The ampule was evacuated to at least about 0.1 mm Hg and sealed. Polymerization was accomplished by placing the sealed ampule in a 250° C. oven for about 28 hours.

Another method of thermal polymerization involves the use of a boron trichloride-triphenyl phosphate adduct as a catalyst. In a tube containing 50 grams of phosphonitrilic chloride trimer, 0.8115 grams (0.108 mole) of the catalyst was added. The evacuated and sealed tube was then heated for a period of 27 to 29 hours to accomplish the polymerization.

Synthesis of poly(fluoroalkylphosphazenes): Mixed-substituent poly(fluoroalkoxyphosphazenes) were prepared by dissolving the polydichlorophosphazene in about 800 milliliters of toluene for about 18 hours. The resulting solution was filtered over silane-treated glass wool. Metallic sodium in small chunks was then added to a separate 2 liter 3-neck flask equipped with a condenser, addition funnel, and nitrogen inlets and outlets. About 800 milliliters of tetrahydrofuran was added. Equimolar amounts (except for OCTA7030; Formula (2)) of the fluorinated: alcohols were added to the addition funnel and these were added dropwise to the stirred sodium metal in tetrahydrofuran. After the addition was completed, the resulting mixture was stirred for at least 12 hours at room temperature and then refluxed for 3 hours to ensure complete reaction of the metallic sodium. To the refluxing mixture, the polydichlorophosphazene solution was added over a period of about 2 hours. After complete addition, the resulting slurry was refluxed for 48 hours. The mixture was cooled and acidified using a 10% (volume/volume) HCl solution. The residual tetrahydrofuran and toluene were removed under reduced pressure. The resulting gum was then washed repeatedly with distilled water until the effluent no longer tested positive for chloride using a silver nitrate solution. The polymer was dried in a vacuum oven (60° C.) for 12 hours and then dissolved (acetone was used for TETRA5050, HEXA5050, OCTA5050 and OCTA7030; (Formulas (2,4, 6, and 7, respectively)); 9:1 Freon TA/acetone was used for PENTA5050 and HEPTA5050: (Formulas 3, 5, respectively))). The polymers were purified twice by precipitation into hexane.

Another aspect of the synthetic process involved the incorporation of crosslinkable substituents such as allylic functionalized alkoxides as a potential crosslinking site. Examples of such functionalization include the 2-allyl phenol and the eugenoxy group. Incorporation of the crosslinkable substituent was accomplished by adding the sodium or potassium salt of 2-allyl phenol or eugenoxide to the poly (dichlorophosphazene) either before or simultaneous with the fluorinated alcohols. The level of incorporation depends on the desired properties of the polyphosphazene. The percent molar concentration of allylic functionalized alkoxide substituents (of total substituent content) can vary, e.g., about 0.25 mole percent to about 10 mole %, with about 0.5 to about 5 mole percent preferred.

Properties of the Synthesized Polyphosphazenes:

Films of the polyphosphazenes (0.0254 to 0.0762 millimeters thick) were cast from a solution containing the polymer, a solvent, and a small amount of a peroxide curing agent such as benzoyl peroxide or dicumyl peroxide. After solvent removal under vacuum, the crosslinking reaction was initiated by heating at the proper temperature for the peroxide used for a period of three hours.

The physical properties and actuation parameters of various elastomeric films comprising conductive carbon grease compliant electrodes were measured or calculated. The electromechanical energy density e was estimated from the peak field strength and the relative thickness strain for comparison with other actuator materials. The effective compressive stress p was calculated using the following equation:

$$p = \epsilon \epsilon_0 E^2$$

where $\epsilon$ is the relative dielectric constant of the material, so is the permittivity of free space ($8.85 \times 10^{-12}$ farad per meter), and E is the electric field (volts per meter). The dielectric constant and Young's modulus were measured by standard techniques. Strain measurements were made with films stretched on a rigid frame. The active, electroded fraction of the films was small relative to the total area of the film. When a voltage difference was applied to the top and bottom electrodes, the active region expanded while the inactive region contracted. A digital video system was used to measure the actuated strain. Measurements were taken at about 1 minute after application of the voltage. The relative area strain was measured directly and the relative thickness strain was calculated using a constant volume constraint. As used herein J/cm$^3$ is joules per cubic centimeter, V/$\mu$m is volts per micrometer, MPa is megapascals, and kHz is kilohertz.

TABLE 1

Actuation parameters of polyphosphazene actuators

| Polymer Type | Elastic Energy Density, ½ e (J/cm³) | Effective Compressive Stress (MPa) | Relative Thickness Strain (%) | Relative Area Strain (%) | Young's Modulus (MPa) | Electric Field (V/μm) | Dielectric Constant (@ 1 kHz) |
|---|---|---|---|---|---|---|---|
| PHZ 1 | 0.02 | 0.15 | −18 | 22 | 0.8 | 69 | 6.9 |
| PHZ 2 | 0.015 | 0.134 | −22 | 28 | 0.6 | 66 | 7.1 |
| PHZ 3 | 0.02 | 0.16 | −24 | 31 | 0.69 | 79 | 6.1 |
| PHZ 4 | 0.06 | 0.3 | −33 | 50 | 0.9 | 65 | 8.0 |
| PHZ 5 | 0.04 | 0.22 | −36 | 56 | 0.62 | 86 | 7.0 |
| PHZ 6 | 0.015 | 0.12 | −41 | 68 | 0.3 | 64 | 6.7 |
| PHZ 7 | 0.1 | 0.5 | −40 | 68 | 1.2 | 132 | 6.2 |
| PHZ 8 | 0.013 | 0.13 | −44 | 80 | 0.8 | 62 | 7.2 |

NOTE: All curing was done at 100° C. for 3 hrs.
PHZ 1 - OCTA7030 with 1.0 mole % eugenoxy group, cured with 1.0 pph of benzoyl peroxide (BP).
PHZ 2 - Same as PHZ 1, but cured with 0.5 pph BP.
PHZ 3 - Same as PHZ 1, but cured with 0.75 pph BP.
PHZ 4 - OCTA7030 with 3.9 mole % eugenoxy group, cured with 1.0 pph BP.
PHZ 5 - OCTA7030 with 2.2 mole % eugenoxy group, cured with 0.33 pph BP.
PHZ 6 - OCTA7030 with 1.0 mole % eugenoxy group, cured with 0.33 pph BP.
PHZ 7 - OCTA7030 with 2.2 mole % eugenoxy group, cured with 1.0 pph BP.
PHZ 8 - OCTA7030 with 1.8 mole % eugenoxy group, cured with 0.5 pph BP.

For comparison, the actuation parameters were measured for elastomeric actuators comprising elastomers other than polyphosphazenes as described in Table 2.

TABLE 2

Comparative examples

| Polymer Type | Elastic Energy Density, ½ e (J/cm³) | Effective Compression Stress (MPa) | Relative Thickness Strain (%) | Relative Area Strain (%) | Young's Modulus (MPa) | Electric Field (V/μm) | Dielectric Constant (@ 1 kHz) |
|---|---|---|---|---|---|---|---|
| Polyurethane elastomer | 0.09 | 1.6 | −11 | 12 | 17 | 160 | 7.0 |
| Fluoroelastomer | 0.027 | 0.65 | −8 | 9 | 2.5 | 32 | 12.7 |
| Polybutadiene | 0.013 | 0.2 | −12 | 14 | 1.7 | 76 | 4.0 |
| Natural Rubber | 0.0016 | 0.11 | −11 | 12 | 0.85 | 67 | 2.7 |
| Ethylene Vinyl Acetate Rubber | 0.021 | 0.28 | −7.4 | 8 | 3.8 | 80 | 4.9 |
| Ethylene-acrylic Rubber | 0.0051 | 0.072 | −7.1 | 8 | 1.0 | 38 | 5.6 |
| Epoxidized Natural Rubber | 0.01 | 0.33 | −5.4 | 6 | 6 | 110 | 3.1 |

Comparing the data in Tables 1 and 2, the polyphosphazene actuators can have larger relative area strains and relative thickness strains than other elastomeric actuators. The polyphosphazene actuators can have relative area strains of greater than or equal to about 20%, greater than or equal to about 30%, greater than or equal to about 50%, and even greater than or equal to about 80%. For comparison, the other elastomers have relative strains of about 6% to about 14%. The relative thickness strain for the polyphosphazene polymers is about −18% to about −44%, compared to about −5% to about −12% for the other elastomers. The polyphosphazene actuators have a narrow range of dielectric constants of about 6 to about 8 kHz compared to about 3 to about 13 kHz for the other elastomers; an electric field strength of about 60 to about 132 V/μm comparable to about 30 to about 160 for the other elastomers; and a Young's modulus of about 0.3 to about 1.2 compared to the other elastomers which can be around 1 or even much higher (e.g., 3.8, 6, 17).

Transducers comprising a polyphosphazene elastomer film disposed between two electrodes have been described. In contrast to the acrylate and silicone polymer films, the polyphosphazene elastomers have a combination of both good elastic properties as well as suitable tear strengths. For use in transducer applications, elastomers having low modulus, high elongation, high dielectric constant, low dielectric losses, good elastic characteristics and high electric field strength are desired. The polyphosphazene films can have tear strengths of about 25.4 kiloNewtons/meter (kN/m), while for a comparable silicone elastomer the tear strength is about 11 kN/m. The polyphosphazene films have a dielectric constant of about 6 to about 8 at 1 kHz, an electric field strength of up to about 132 V/μm, a low elastic modulus of the order of 1 MPa, and high elongation of greater than or equal to 500%. Actuators comprising the polyphosphazene films can have area strain values of greater than or equal to 80%, and possibly even higher. This combination of properties makes the polyphosphazene films suitable for a wide range of high-performance actuator applications such as robotics, loudspeakers and prosthetic devices.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A transducer comprising:
   a first electrode;
   a second electrode;
   and an elastomeric film disposed therebetween;
   wherein the elastomeric film comprises a polyphosphazene having Formula (1):

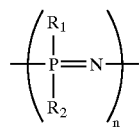

(1)

wherein each $R_1$ and $R_2$ is independently selected from chloro; bromo; iodo; substituted and unsubstituted alkyl, alkenyl, or alkynyl; aralkyl; alkaryl; aryl; heteroalkyl; heteroaryl; cyano; amino acid ester; carboxylic acid ester; oxyaryl; alkoxy; haloalkoxy, fluoroalkoxy, oxy(aliphatic) hydroxyl; oxy(alkyl)hydroxyl; oxyalkaryl; oxyaralkyl; thioaryl; thioalkyl; thioalkaryl; aliphatic ketone; aryl ketone; phosphine oxide; phosphoryl; sulfone; and sulfoxide; and wherein n is about 20 to about 50,000.

2. The transducer of claim 1, wherein $R_1$ and $R_2$ are different.

3. The transducer of claim 2, wherein $R_1$ is $OCH_2CF_3$, and $R_2$ is $OCH_2CF_2CF_3$, $OCH_2CF_2CF_2H$, $OCH_2(CF_3)_2$, $OCH_2CF_2CF_2CF_3$, $OCH_2CF_2CF_2CF_2CF_2$, or a combination comprising one or more of the foregoing substituents.

4. The transducer of claim 1, wherein the polyphosphazene comprises allyl crosslinking substituents, vinyl crosslinking substituents, or a combination of one or more of the foregoing substituents.

5. The transducer of claim 4, wherein the crosslinking substituent is a eugenoxy substituent, a 2-allyl phenoxy substituent, or a combination comprising one or more of the foregoing substituents.

6. The transducer of claim 1, wherein the elastomeric film has a thickness of about 5 micrometers to about 250 micrometers.

7. The transducer of claim 1, wherein the elastomeric film is a multilayer film.

8. The transducer of claim 1, wherein the first electrode, the second electrode, or both, is a compliant electrode.

9. The actuator of claim 8, wherein the compliant electrode comprises a conductive grease, a colloidal suspension, carbon nanotubes, carbon fibrils, a metal layer, a conductive polymer, or a combination of one or more of the foregoing materials.

10. A method of making a transducer comprising:
    disposing a first electrode on a first side of an elastomeric film, and
    disposing a second electrode on a second side of the elastomeric film opposite the first side,
    wherein the elastomeric film comprises a polyphosphazene having Formula (1):

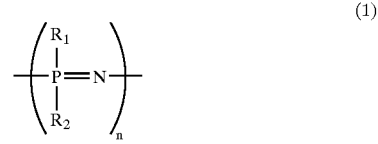

(1)

wherein each $R_1$ and $R_2$ is independently selected from chloro; bromo; iodo; substituted and unsubstituted alkyl, alkenyl, or alkynyl; aralkyl; alkaryl; aryl; heteroalkyl; heteroaryl; cyano; amino acid ester; carboxylic acid ester; oxyaryl; alkoxy; haloalkoxy; fluoroalkoxy; oxy(aliphatic) hydroxyl; oxy(alkyl)hydroxyl; oxyalkaryl; oxyaralkyl; thioaryl; thioalkyl; thioalkaryl; aliphatic ketone; aryl ketone; phosphine oxide; phosphoryl; sulfone; and sulfoxide; and wherein n is about 20 to about 50,000.

11. The method of claim 10, wherein $R_1$ and $R_2$ are different.

12. The method of claim 11, wherein $R_1$ is $OCH_2CF_3$, and $R_2$ is $OCH_2CF_2CF_3$, $OCH_2CF_2CF_2H$, $OCH_2(CF_3)_2$, $OCH_2CF_2CF_2CF_3$, $OCH_2CF_2CF_2CF_2CF_2$, or a combination comprising one or more of the foregoing substituents.

13. The method of claim 10, wherein the polyphosphazene comprises allyl crosslinking substituents, vinyl crosslinking substituents, or a combination of one or more of the foregoing substituents.

14. The method of claim 13, wherein the crosslinking substituent is a eugenoxy substituent, a 2-allyl phenoxy substituent, or a combination comprising one or more of the foregoing substituents.

15. The method of claim 10, wherein the elastomeric film has a thickness of about 5 micrometers to about 250 micrometers.

16. The method of claim 10, wherein the elastomeric film is a multilayer film.

17. The method of claim 10, wherein the first electrode, the second electrode, or both, is a compliant electrode.

18. The method of claim 17, wherein the compliant electrode comprises a conductive grease, a colloidal suspension, carbon nanotubes, carbon fibrils, a metal layer, a conductive polymer, or a combination of one or more of the foregoing materials.

19. A method of converting between electrical energy and mechanical energy, comprising:
    applying an electric charge to a transducer comprising a first electrode, a second electrode, and an elastomeric film disposed there between; wherein the elastomeric film comprises a polyphosphazene having Formula (1):

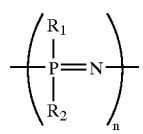 (1)

wherein each $R_1$ and $R_2$ is independently selected from chloro; bromo; iodo; substituted and unsubstituted alkyl, alkenyl, or alkynyl; aralkyl; alkaryl; aryl; heteroalkyl; heteroaryl; cyano; amino acid ester; carboxylic acid ester; oxyaryl; alkoxy; haloalkoxy; fluoroalkoxy; oxy(aliphatic) hydroxyl; oxy(alkyl)hydroxyl; oxyalkaryl; oxyaralkyl; thioaryl; thioalkyl; thioalkaryl; aliphatic ketone; aryl ketone; phosphine oxide; phosphoryl; sulfone; and sulfoxide; and wherein n is about 20 to about 50,000;

producing material strain in the elastomeric film.

20. The method of claim 19, wherein $R_1$ is $OCH_2CF_3$, and $R_2$ is $OCH_2CF_2CF_3$, $OCH_2CF_2CF_2H$, $OCH_2(CF_3)_2$, $OCH_2CF_2CF_2CF_3$, $OCH_2CF_2CF_2CF_2CF_2$, or a combination comprising one or more of the foregoing substituents.

21. The method of claim 19, wherein the polyphosphazene comprises allyl crosslinking substituents, vinyl crosslinking substituents, or a combination of one or more of the foregoing substituents.

22. The method of claim 19, wherein the first electrode, the second electrode, or both, is a compliant electrode.

23. The method of claim 19, wherein pre-strain is applied to the actuator in one linear direction prior to applying an electric charge.

* * * * *